(12) United States Patent
Ash, Jr.

(10) Patent No.: US 6,421,253 B1
(45) Date of Patent: Jul. 16, 2002

(54) DURABLE LAMINATED ELECTRONICS ASSEMBLY USING EPOXY PREFORM

(75) Inventor: Daniel Ray Ash, Jr., Folsom, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 09/658,398

(22) Filed: Sep. 8, 2000

(51) Int. Cl.$^7$ .............................. H05K 7/04; H05K 7/20
(52) U.S. Cl. ...................... 361/808; 361/719; 361/720; 361/760; 361/783; 361/807; 29/831; 29/832; 29/840
(58) Field of Search .................. 361/748, 760, 361/761, 764, 782, 783, 792, 794, 795, 807, 808, 810, 816, 818, 719, 720; 174/255–260; 333/246, 247; 330/65–68; 29/830–832, 840, 846

(56) References Cited

U.S. PATENT DOCUMENTS

| | | | |
|---|---|---|---|
| 3,982,271 A | * 9/1976 | Olivieri et al. ............. 333/247 |
| 4,184,133 A | * 1/1980 | Gehle ......................... 333/246 |
| 4,404,059 A | * 9/1983 | Livshits et al. ............. 29/846 |
| 4,616,413 A | * 10/1986 | Iliou et al. .................... 29/832 |
| 4,912,547 A | * 3/1990 | Bilowith et al. ............ 257/758 |
| 4,967,316 A | * 10/1990 | Goebel et al. ............... 361/816 |
| 5,073,840 A | * 12/1991 | Coors ......................... 174/255 |
| 5,132,648 A | * 7/1992 | Trinh et al. ................. 333/247 |
| 5,143,785 A | 9/1992 | Pujol et al. |
| 5,352,991 A | * 10/1994 | Lipschultz et al. .......... 330/66 |
| 5,355,280 A | * 10/1994 | Rothlingshofer et al. ... 174/252 |
| 5,447,996 A | 9/1995 | Asai et al. |
| 5,502,889 A | 4/1996 | Casson et al. |
| 5,652,055 A | 7/1997 | King et al. |
| 5,652,696 A | * 7/1997 | Traylor et al. .............. 361/764 |
| 5,661,902 A | * 9/1997 | Katchmar .................... 29/840 |
| 5,668,584 A | 9/1997 | Broder et al. |
| 5,672,226 A | 9/1997 | Deardorf |
| 5,727,310 A | 3/1998 | Casson et al. |
| 5,733,823 A | 3/1998 | Sugioka et al. |
| 5,751,553 A | * 5/1998 | Clayton ....................... 361/749 |
| 5,759,737 A | 6/1998 | Feilchenfeld et al. |
| 5,796,304 A | * 8/1998 | Gentzler ...................... 330/52 |
| 5,799,392 A | 9/1998 | Mishiro |
| 5,807,959 A | 9/1998 | Wu et al. |
| 5,831,828 A | * 11/1998 | Cutting et al. .............. 174/252 |
| 5,840,417 A | 11/1998 | Bolger |
| 5,886,415 A | 3/1999 | Akagawa |
| 5,912,282 A | 6/1999 | Iyer et al. |
| 6,188,579 B1 | * 2/2001 | Buondelmonte et al. ..... 29/831 |
| 6,201,701 B1 | * 3/2001 | Linden et al. .............. 174/252 |
| 6,292,374 B1 | * 9/2001 | Johnson et al. ............. 174/252 |

* cited by examiner

*Primary Examiner*—David L. Talbott
*Assistant Examiner*—John B. Vigushin
(74) *Attorney, Agent, or Firm*—Myers, Dawes & Andras LLP (57) ABSTRACT

A delamination resistant electronics module assembly includes a printed circuit board layer coupled to a pallet via a cured epoxy preform. The preform may include conductive epoxy, or non-conductive epoxy with conductive traces. Component wells are collectively formed by the preform and PCB layer for placement of heat generating components, such as RF components. Methods of manufacturing module assemblies include curing the epoxy preform by applying a predetermined elevated pressure and heat to a sub-assembly of the pallet, preform layer, and PCB layer.

41 Claims, 7 Drawing Sheets

DURABLE LAMINATED ELECTRONICS ASSEMBLY USING EPOXY PREFORM

BACKGROUND OF THE INVENTION

1. Field of the Invention

The present invention relates generally to electronics modules and specifically to a module assembly incorporating a printed circuit board and a pallet. The invention further relates to methods of manufacture of such electronics modules.

2. Description of Related Art

Electronics modules for relatively high power applications, such as RF power amplifiers, typically include one or more printed circuit boards (PCBs) and/or discrete electronic components coupled to a metallic pallet. The pallet provides electrical grounding and transfer of heat generated by the PCB and various electronic components. In a conventional electronics module assembly, the printed circuit board is mounted to the pallet by means of fasteners, such as bolts. Since the sizes of pallets and printed circuit boards tend to be small, the use of bolts occupy a substantial amount of space relative to the area of the printed circuit board. As a result, the printed circuit board has less room for electronic components, such as RF transistors.

Furthermore, a bolted connection does not provide a substantially uniform connection between the printed circuit board and the pallet. As a result, thermal transfer to the pallet may be uneven and less efficient overall. This reduces the lifetime of the electronics in the assembly. Another approach to mounting the module to the pallet employs bonding the module to the pallet. This approach also provides uneven thermal connection to the pallet. Also, an assembly may become loose over time as the PCB moves away from the pallet, leading to loss of necessary grounding and heat diffusion. Assemblies employing fasteners are also vulnerable to separation caused by temperature cycling, which occurs frequently in RF applications.

What is needed, therefore, is a more reliable electrical and thermal connection for electronics modules which will not degrade over time and temperature cycling. What is further needed is a process for assembling electronics modules and pallets that provides greater manufacturability.

SUMMARY OF THE INVENTION

The present invention provides structures and methods which overcome the deficiencies in the prior art.

In one aspect, a durable, electronics module assembly with a conductive preform layer is provided. The first preferred embodiment includes a bottom pallet having recesses conforming to the underside traces of the PCB layer. The top surface of the pallet is plated with gold. Solder mask is applied to the top surface for directing the placement of electronic components. The conductive preform layer includes trace apertures conforming to the underside traces of the PCB layer. Spacing is provided in the preform layer for receiving electronic components. The conductive preform layer is sandwiched between the bottom pallet and a top printed circuit board layer. The bottom surface includes conductive traces and a protruding waffle pattern for providing better adhesion to the preform.

In a further aspect, a method for manufacturing the first embodiment is provided which includes a laminating process. The laminating process comprises placing the pallet, epoxy preform layer and PCB in a laminating fixture, thus forming a pre-cured sub-assembly. The preform layer is cured by simultaneously heating the sub-assembly while applying pressure. The fixture is placed within an oven at a predetermined temperature and within a press that applies a predetermined pressure to the sub-assembly via a press pad. In a preferred embodiment wherein thermal set epoxy is employed, the preform may be cured by applying pressure to the sub-assembly while maintaining the sub-assembly at or above the thermal set temperature of the epoxy. The cured sub-assembly may be cooled by inserting the laminating fixture into a cold press. Pressure should still be applied to sub-assembly as it is cooled. The cured sub-assembly is removed from the fixture and any excess epoxy resin in the component wells is removed. The cured sub-assembly is examined for any delamination to ensure that a seal is formed around the border of the entire structure.

In another aspect, an electronics module assembly with a primarily non-conductive preform layer is provided. Unlike the first preferred embodiment, this alternate embodiment comprises a non-conductive preform layer with traces of conductive epoxy disposed thereon. The conductive epoxy traces provide grounding of the PCB layer and certain RF electrical components included within the assembly. This embodiment of the invention may be preferred in some applications.

A method is also provided for manufacturing the electronics module assembly with the primarily non-conductive preform layer. This method for fabricating the second preferred embodiment also includes the lamination process according to the invention.

In a further aspect, an RF power amplifier assembly according to the invention comprises a housing, a circuit including an input signal to be amplified and an output signal, and an electronics module assembly including a printed circuit board layer, an epoxy preform layer, and a pallet.

It will be appreciated that the above summarized methods of assembly and manufacture can provide a high performance electronics module assembly with excellent thermal and electrical connection due to the lamination of the PCB layer to the pallet with the epoxy preform layer. The assembly is resistant to delamination or other degradation over time despite thermal cycling. It will also be appreciated that the methods provided lead to greater ease of automation and lower cost in manufacturing.

The invention, now having been briefly summarized, may be better appreciated by the following detailed description.

Detailed Description Of The Preferred Embodiments

The invention and its various embodiments can now be better understood by turning to the following detailed description wherein illustrated embodiments are described. It is to be expressly understood that the illustrated embodiments are set forth as examples and not by way of limitations on the invention as ultimately defined in the claims.

Figure 1:
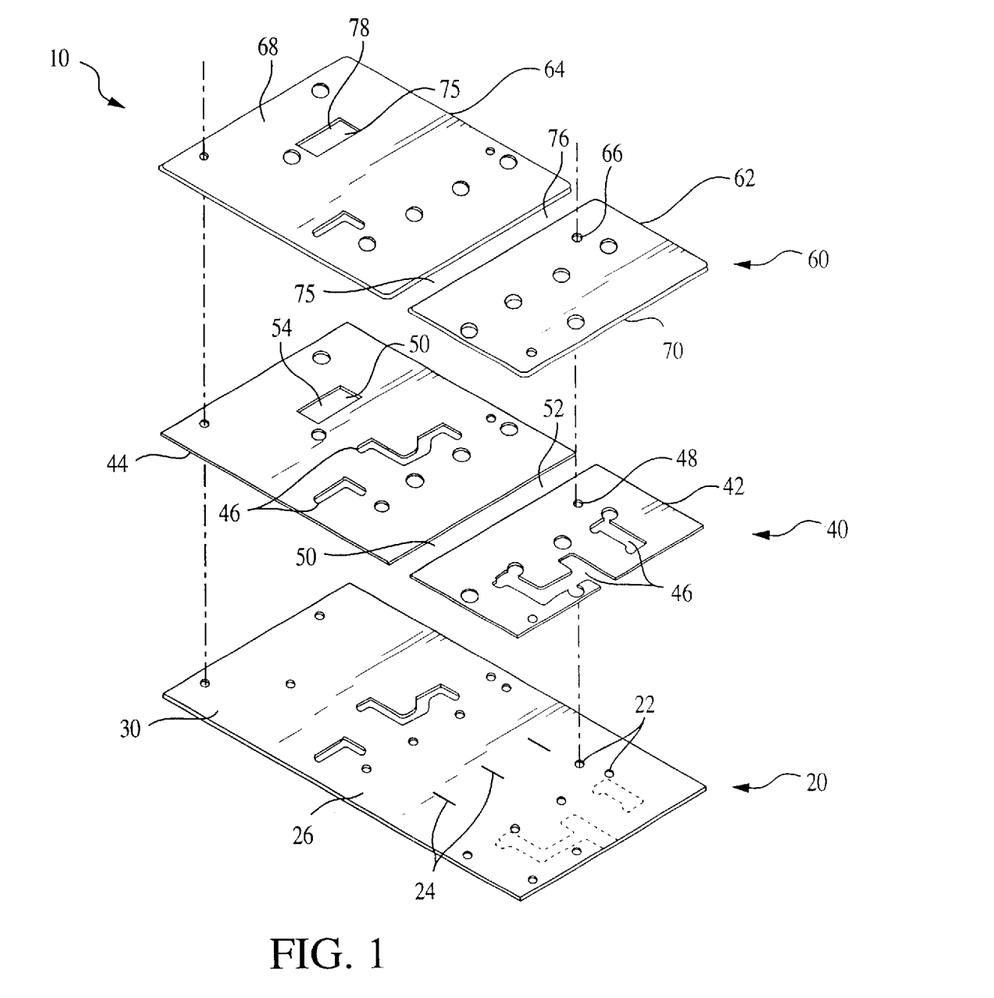
FIG. 1 is an exploded view of a first embodiment of an electronics assembly comprising a conductive preform.

FIG. 1 is an exploded view of a first embodiment of an electronics module assembly 10. The assembly 10 comprises a support 20, a conductive preform layer 40, and a printed circuit board layer 60. In particular, the assembly 10 may comprise any of a number of RF modules (illustrated in FIG. 4) used in a RF power amplifier assembly, such as an input amplifier, error amplifier, and main amplifier, each of which will have an associated thermal coupling to a heat sink (not shown) via the thermally conductive support 20. The assembly may comprise other modules which do not require heat sinks, such as phase control circuitry, etc. The electronics of the assembly 10 may include the disclosure provided by U.S. Pat. No. 5,796,304 to Gentzler, which is incorporated by reference as though fully set forth herein.

The support 20 comprises a pallet composed of a metal having high thermal transfer characteristics, such as copper or aluminum. Mounting holes 22 are provided, as with the preform 40 and the printed circuit board 60, to enable the assembly 10 to be mounted onto a base within a housing (not shown). Gold plating 30 may be applied to the top surface 26 of the pallet 20 to improve bond strength. The pallet 20 has strips of solder mask 24 configured on a top surface 26 for the separation of electronic components to be added, or for the separation of solder preforms upon which the electronic components would be placed. In the preferred embodiment, the solder mask, or plating, preferably comprises nickel and gold and has a thickness of roughly 150 micro inches. The pallet 20 preferably has a thickness of approximately 0.150 inch. It is to be expressly understood, however, that the dimensions of the pallet as well as the solder mask may vary greatly depending upon the application. Recesses 28 shaped in the form of traces are formed in the top surface 26 of the pallet 20 by, for example, machining. The recesses 28 are aligned with and shaped according to the conductive traces formed on a bottom surface of the printed circuit board, as will be described later, so as to avoid grounding the traces.

In FIG. 1, the preform layer 40 of the first embodiment includes a sheet of conductive epoxy to be placed on the top surface 26 of the pallet 20. The conductive epoxy is preferably composed of a thermal set material which does not melt once it is already reflowed. In the preferred embodiment, two sheets 42, 44 of conductive epoxy are provided and spaced apart from each other so as to form a spacing, or arrangement of spacing, 50, shown here as a gap 52, adapted for placement of electronic components, such as RF power transistors, or for solder preforms upon which the electronic components would be placed. It is to be understood that the preform layer 40 may include a single integral sheet of conductive epoxy with holes formed therein to accomplish the same purpose. Depending upon the location of the conductive traces on the bottom surface of the printed circuit board, the sheets 42, 44 also include trace apertures 46 which, similar to the recesses 28 of the pallet 20, are aligned with and shaped according to the PCB underside traces. Mounting holes 48 are formed in the sheets 42, 44 which are aligned with the mounting holes 22 of the pallet 20.

Figure 2:
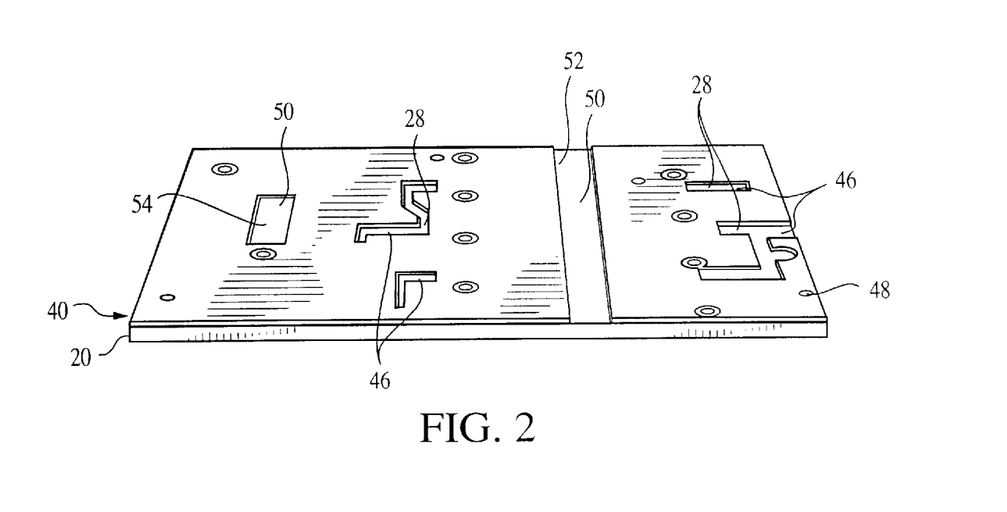
FIG. 2 is a perspective view of a partial electronics assembly of FIG. 1 comprising a pallet and the conductive preform.

As shown in FIG. 2, when the preform layer 40 is disposed on top of the pallet 20, the trace apertures 46 and mounting holes 48 are aligned with the recesses 28 and pallet mounting holes, respectively. In addition to the gap 52, the spacing 50 of the preform layer 40 may also include a component aperture 54 shaped according to the profile or bottom surface of an electronic component to be coupled to the pallet 20. For example, the component aperture 54 may comprise a rectangular shape corresponding to the rectangular profile of an RF power transistor. The spacing 50, including the gap 52 and the component aperture 54, is thus configured for receiving electronic components, or solder preforms upon which the electronic components would be disposed.

In FIG. 1, the printed circuit board layer 60 also comprises multiple pieces, or sheets, 62, 64 of PCB material spaced apart from each other to form a gap 72 therebetween in similar fashion to the arrangement of the preform sheets 42, 44. The PCB layer 60 also includes mounting holes 66 aligned with the preform mounting holes 48 and the pallet mounting holes 22. The PCB layer 60 includes a top surface 68 and a bottom surface 70.

Figure 3:
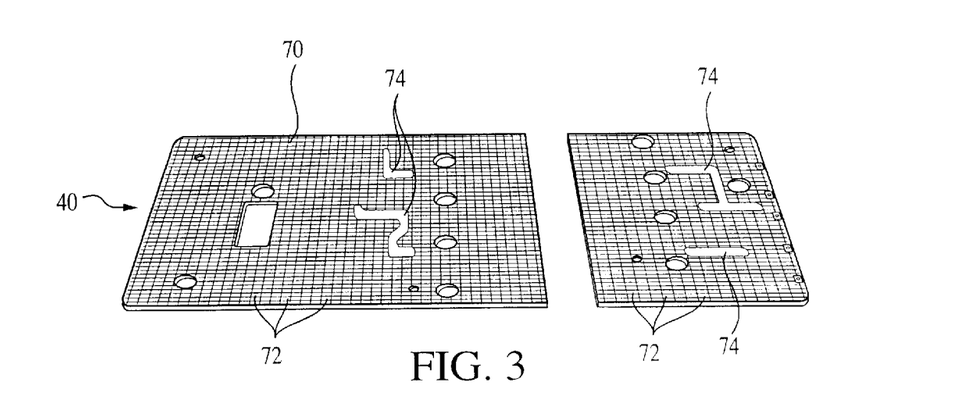
FIG. 3 is a bottom plan view of a printed circuit board according to the present invention.

As shown in FIG. 3, the bottom surface 70 includes waffle patterning 72 which provides improved adhesion to the epoxy preform layer 40. The bottom surface 70 further comprises conductive traces 74 which are patterned according to the electronics formed on the top surface 68 of the PCB layer 60. Thus, as previously disclosed, the trace apertures 46 in the preform layer 40 and the recesses 28 in the support 20 are configured in accordance with the conductive traces 74. The spacing 75 of the PCB layer 60 includes the gap 76 and a component aperture 78.

Figure 4:
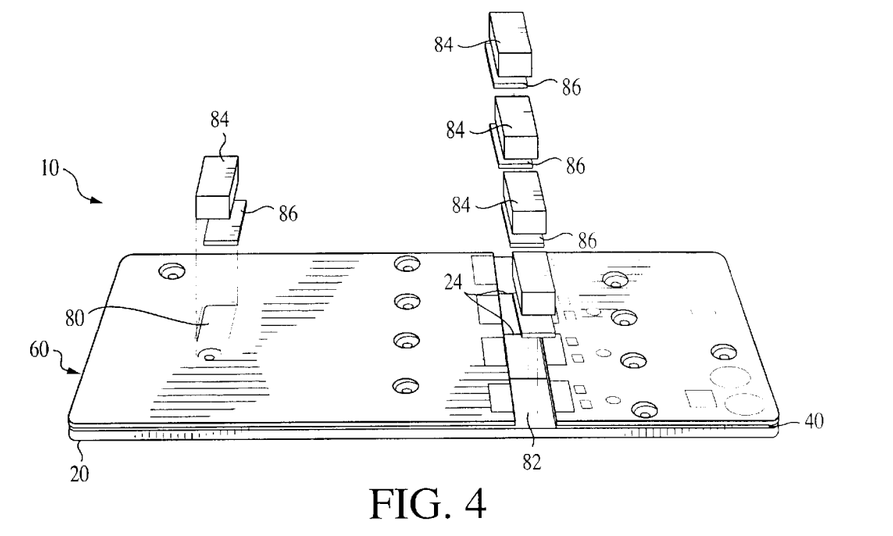
FIG. 4 is a perspective view of a partial electronics assembly comprising a pallet, conductive preform, and a printed circuit board.

It will be appreciated that the preform spacing 50 and the PCB spacing 75 collectively form wells 80, 82, as shown in FIG. 4, for receiving electronic components and the solder preforms supporting the components. Specifically, the lower component aperture 54 in the preform layer 40 and the upper component aperture 78 in the PCB layer 60 collectively form a first rectangular well 80, as shown in FIG. 4, for receiving a single electronic component, such as an RF power transistor. Similarly, the lower gap 52 in the preform layer 40 and the upper gap 76 in the PCB layer 60 collectively form a second well 82, as shown in FIG. 4, for receiving a plurality of electronic components, such as parallel RF power transistors. It is to be understood that more or less gaps and/or component apertures may be formed in the preform layer 40 and the PCB layer 60 so as to accommodate the number, spacing and arrangement of electronic components as may be desired. For example, the preform layer 40 and the PCB layer 60 may each comprise three separate pieces so as to form two gaps in each layer. Alternatively, each layer 40, 60 may comprise a single integral structure, thus omitting any gaps, while including multiple component apertures for receiving components which would then be disposed in isolation from each other.

FIG. 4 illustrates the assembly 10 when the PCB layer 60 is laminated or coupled to the pallet 20. In FIG. 4, the electronic components 84 and the supporting solder preforms 86 are shown in exploded view. The solder preforms 86 comprise a non-conductive epoxy preform that is composed of a thermal set material. It will be appreciated that the first component well 80 receives a single solder preform 86 and corresponding electronic component 84. It will further be appreciated that the second, larger well 82 receives a plurality of solder preforms 86 and electronic components 84 (shown here as four in a row) which are conveniently placed as guided by the dividing solder masks 24. In one embodiment, the electronic components 84 comprise RF power transistors.

Figure 5:
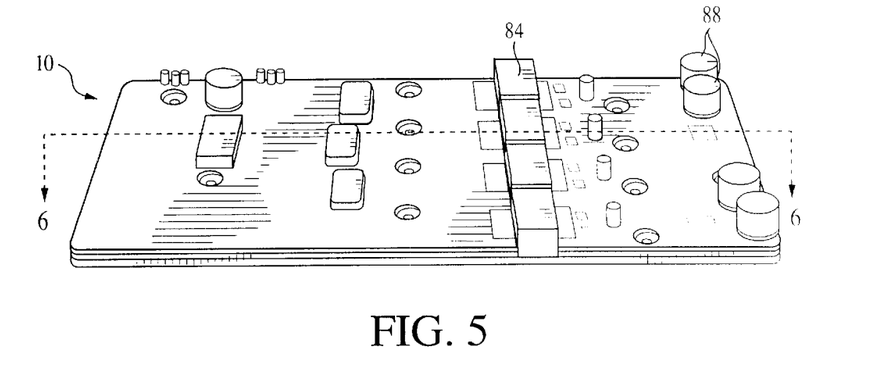
FIG. 5 is a perspective view of the first embodiment the electronics assembly.

FIG. 5 illustrates in perspective view of the assembly 10 wherein the RF transistors 84 and solder preforms 86 are assembled along with a variety of other electronic components and circuit elements, including SMT components 88, resistors, capacitors, etc. It will be appreciated that the preform layer 40 obviates the need for fastener flanges, thereby providing more room for electronic components, such as the RF transistors. The capacity of a single module assembly is therefore increased.

Figure 6:
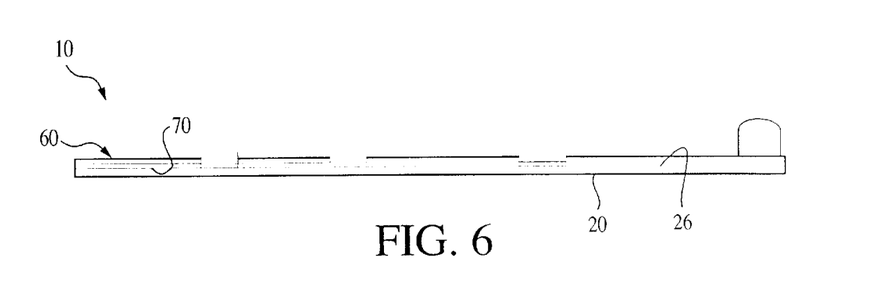
FIG. 6 is a cross-section view of the first embodiment taken along lines 6'—6' of FIG. 5.

FIG. 6 is a cross-sectional view of the assembly 10 taken along lines 6'—6' of FIG. 5. Unlike conventional, fastened structures which leave space between the pallet and the PCB, the apparatus 10 provides an assembly wherein the surface areas of the top surface 26 of the support 20 and the bottom surface 70 of the printed circuit board layer 60 are substantially attached to the preform layer 40. In fact, except for the recesses 28 in the pallet 20, nearly the entire top pallet surface 26 and bottom PCB surface 70 is in contact with the preform layer 40. With the preform layer 40 comprising a conductive epoxy, this provides a more reliable electrical connection between the pallet 20 and the PCB layer 60. Furthermore, since the preform layer 40 is composed of a thermally conductive material, an excellent thermal coupling between the pallet 20 and the PCB layer 60 is provided. It will also be appreciated that the epoxy preform provides a tightly laminated structure wherein the edges of the assembly 10 are sealed. This provides greater resistance to delamination forces that occur as a result of temperature cycling and passage of time. Such delamination over time could lead to loss of thermal coupling to the pallet and/or loss of electrical grounding, which results could be disastrous to the performance of the electronics assembly. However, extensive testing has established that the assembly described above, manufactured in accordance with the below process flow, is resistant to delamination and degradation over time and temperature cycling.

Figure 7:
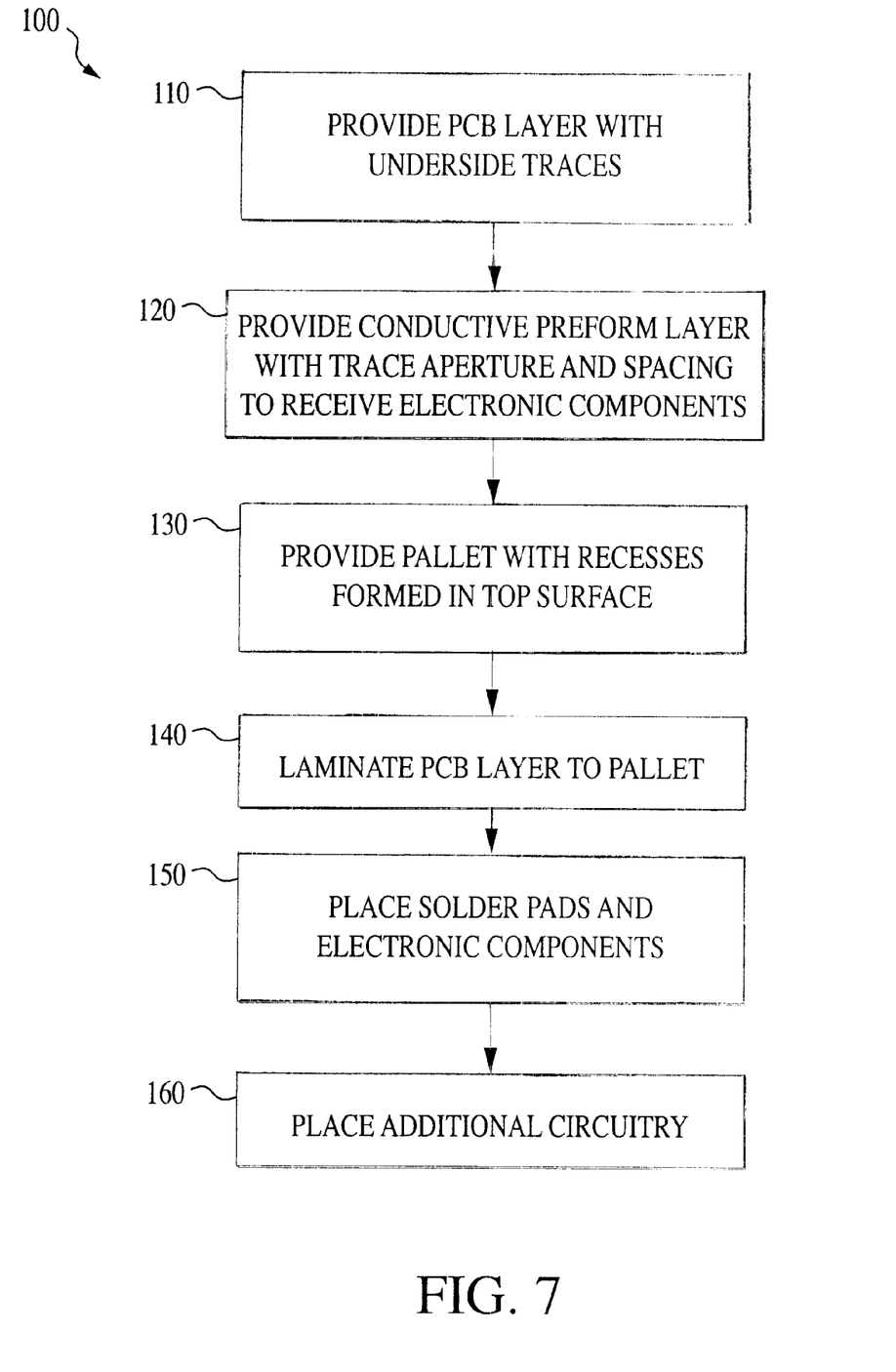
FIG. 7 is a flow diagram illustrating a process of manufacturing the first embodiment of the electronics assembly.

FIG. 7 is a flow diagram illustrating a process 100 of manufacturing the first embodiment of the module assembly 10, i.e. the conductive preform embodiment. In step 110, a printed circuit board (PCB) layer is provided. In the preferred process, the bottom surface of the PCB is plated with a thin layer of gold and provided with conductive traces. Mounting holes are formed through the PCB layer. In step 120, a conductive preform layer, described above as preform layer 40 in connection with FIGS. 1–6, is provided. Trace apertures are formed in the sheet or sheets of conductive epoxy conforming to the underside conductive traces of the PCB layer. A thermal set epoxy is used such that the preform layer will not re-melt once the lamination process, described below, is completed. As an example, the epoxy may comprise Ablefilm 5025E. Mounting holes are formed through the preform layer in alignment with the mounting holes of the PCB layer. In step 130, a pallet is provided that is preferably composed of copper. Recesses are formed in the top surface of the pallet conforming to the underside PCB traces. The top surface is plated with a thin layer of gold. A solder mask is then applied to the top surface of the pallet at a region where multiple electronic components will be disposed. In the preferred embodiment, the solder mask is applied to the region of the pallet adjacent to the gaps in the preform layer and the PCB. In effect, this pallet region forms the bottom of a relatively large component well wherein the solder masks divide the region into multiple areas for placement of electronic components. In step 140, the PCB layer is laminated to the pallet using a lamination process described in more detail in FIG. 8. In step 150, conductive solder paste, or solder preforms, are placed in the component wells and electronic components, such as RF transistors, are attached to the solder paste. Step 150 involves reflowing the solder in the assembly such that the electronic components are secured to the pallet by the solder. Since the preform layer comprises a thermal set material, it will not melt as the solder preforms are being reflowed. In step 160, additional circuitry and electronic components may be placed on the PCB layer.

Figure 8:
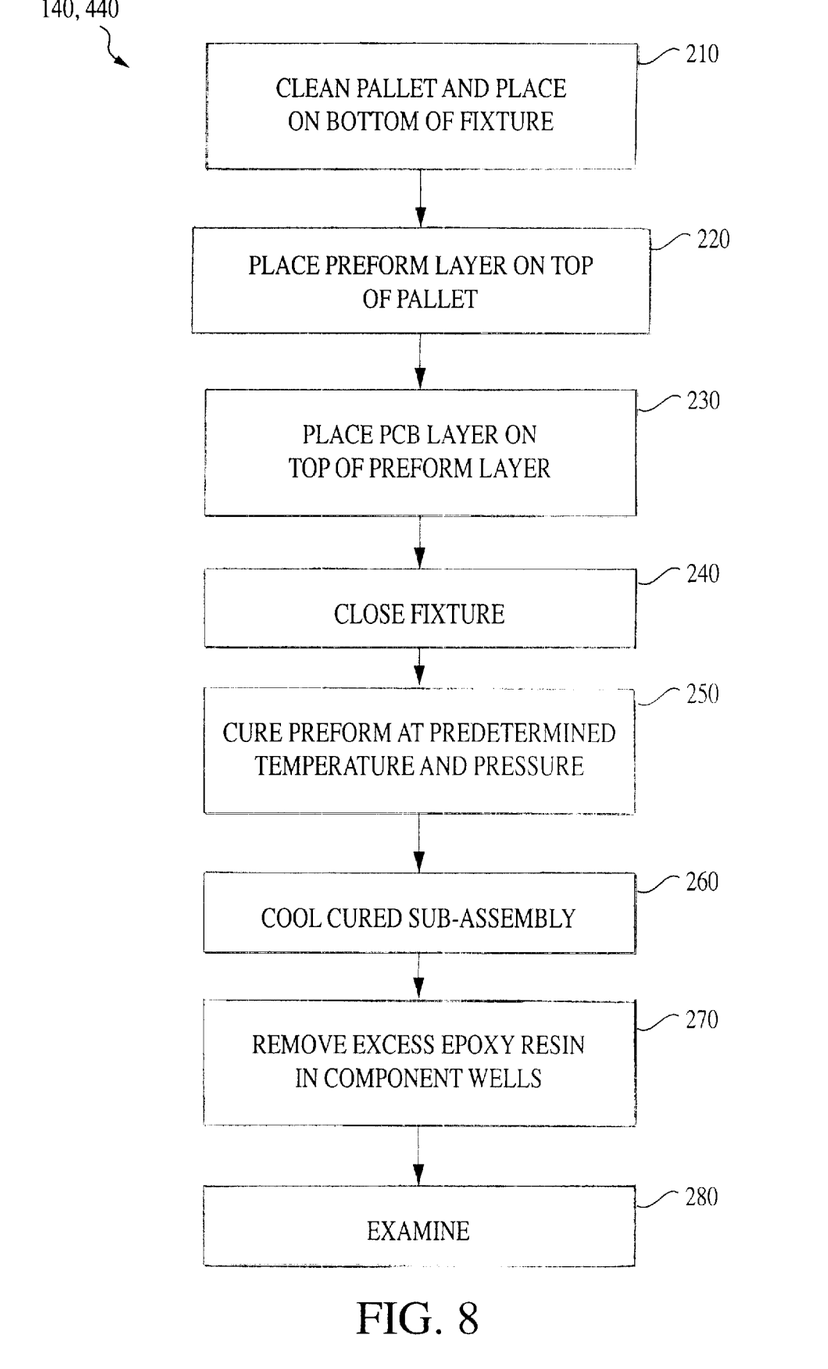
FIG. 8 is a flow diagram illustrating a lamination process according to the invention.

FIG. 8 illustrates the lamination process 140, 440 according to the invention. This process may apply to both the conductive preform process 100 as described above in connection with FIGS. 1–7 as well as the non-conductive preform process 400 which is described below in connection with FIGS. 9–11. Though only one electronics module assembly is described herein, it is to be understood that several module assemblies may be included in a single fixture. In step 210, the pallet is cleaned and placed on the bottom of a laminating fixture according to the invention. The pallet is aligned by inserting alignment pins of the fixture through the mounting holes of the pallet. In step 220, the preform layer is placed on top of the pallet by aligning the preform mounting holes with the alignment pins. Any release paper on the top and bottom of the preform layer is removed. In step 230, the PCB layer is placed on top of the preform layer by aligning the PCB mounting holes with the alignment pins. Thus, a pre-cured sub-assembly comprising the pallet, preform layer, and PCB layer is now formed. Release paper is placed on top of the PCB layer and followed by a press pad on top of the PCB. An Isolam press pad may be employed. In step 240, the lamination fixture containing the pre-cured sub-assembly is closed. In step 250, the preform layer is cured by simultaneously heating the sub-assembly while applying pressure. In the preferred embodiment, the fixture is placed within an oven at approximately 150° C. The fixture is placed within a press that applies pressure evenly to the sub-assembly via the press pad. A pressure of between, for example, 50 to 70 PSI is preferred. It is to be understood that more or less pressure may be applied, although at least about 30 PSI should be applied to the sub-assembly to ensure resistance to delamination. In a preferred embodiment wherein thermal set epoxy is employed, the pressure is applied to the sub-assembly while maintaining the sub-assembly at or above the thermal set temperature of the epoxy. In optional step 260, the now cured sub-assembly is cooled by inserting the laminating fixture into a cold press. Pressure should still be applied to sub-assembly, preferably in the range of 50 to 70 PSI during cooling. In step 270, the cured sub-assembly is removed from the fixture and any excess epoxy resin in the component wells is removed. In step 280, the cured sub-assembly is examined for any partial delamination to ensure that a seal is formed around the border of the entire structure.

Figure 9:
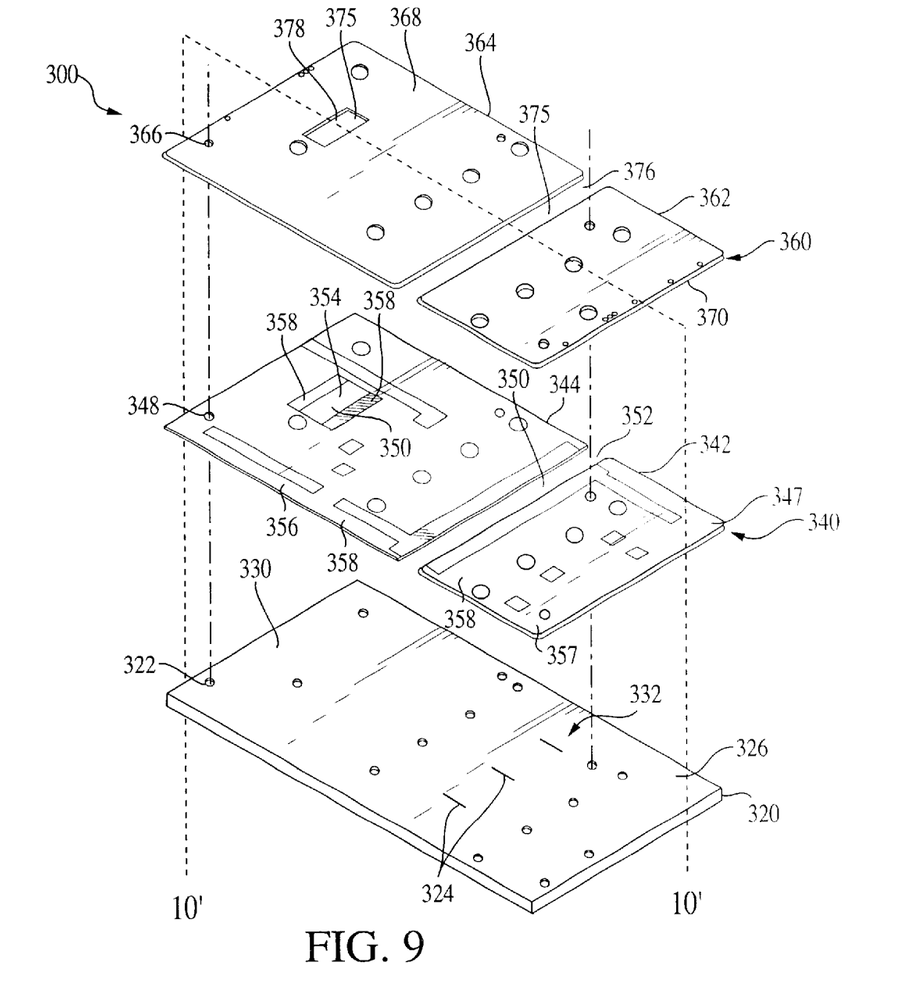
FIG. 9 is an exploded view of the second embodiment.

FIG. 9 is an exploded view of a second preferred embodiment of the electronics module assembly. Unlike the conductive preform embodiment described above, the assembly 300 comprises a substantially non-conductive preform layer 340 having conductive traces 345 formed thereon. The alternate assembly 400 comprises a support 320, the preform layer 340, and the PCB layer 360.

The support 320 comprises a pallet preferably composed of a thermally conductive material, such as copper or aluminum. Mounting holes 322 are defined in the pallet 320. Gold plating 330 may be applied to the top of the pallet 320 to improve bond strength. Solder mask 324 is applied to the top surface 326 in a region 332 where electronic components shall be placed. The support 320 may be substantially similar to the support 20 in the first preferred embodiment except that it does not include recesses. Since the underside PCB traces in the second embodiment 300 will contact the non-conductive epoxy, it is not necessary to form recesses in the pallet for avoiding shorting.

In the second preferred embodiment, the hybrid preform layer 340 comprises a first sheet 342 and a second sheet 344 composed substantially of non-conductive epoxy. The non-conductive epoxy is preferably composed of a thermal set material which does not melt once it is already reflowed. The two sheets 342, 344 of non-conductive epoxy are spaced apart from each other so as to form a spacing, or arrangement of spaces, 350, shown here as a gap 352, adapted for placement of electronic components, or more specifically, for solder preforms upon which the electronic components would be placed. It is to be understood that the preform layer 340 may include a single integral sheet of non-conductive epoxy with holes formed therein to accomplish the same purpose. Unlike the preform layer of the first preferred embodiment, it is not necessary to form trace apertures in the preform layer 340 because the non-conductive epoxy will prevent shorting of the traces on the bottom surface of the PCB layer. Mounting holes 348 are formed in the sheets 342, 344 which are aligned with the mounting holes 322 of the pallet 320. The mounting holes 348 are aligned with the pallet mounting holes 322. In addition to the gap 352, the spacing 350 of the preform layer 340 may also include a component aperture 354 shaped according to the profile or bottom surface of an electronic component to be coupled to the pallet 320. For example, the component aperture 354 may comprise a rectangular shape corresponding to the rectangular profile of an RF power transistor. The spacing 350, including the gap 352 and the component aperture 354, is thus configured for receiving electronic components, or solder preforms upon which the electronic components would be disposed.

Unlike the first embodiment of the preform layer, the second embodiment of the preform layer 340 comprises traces 355 of conductive epoxy disposed on the non-conductive top surface 347. A pattern for receiving the conductive epoxy 355 is stamped or routed in the top surface 347. The conductive epoxy 355 is then laid in the patterned areas as a film or stencil printed in the form of conductive paste. In either case, a silver conductive epoxy may be employed. The conductive traces 355 include lines 356, patches 357 and borders 358 which are strategically placed in accordance with desired grounding of circuitry disposed above the layer 340. More specifically, the lines 356 and patches 357 are disposed where terminations to ground are desired while the borders 358 are located adjacent to the spacing 350 to serve as RF ground for the RF components to be placed in the spacing 350.

In FIG. 9, the printed circuit board layer 360 also comprises multiple pieces, or sheets, 362, 364 of PCB material spaced apart from each other to form a gap 376 therebetween in similar fashion to the arrangement of the preform sheets 342, 344. The PCB layer 360 also includes mounting holes 366 aligned with the preform mounting holes 348 and the pallet mounting holes 322. The PCB layer 360 includes a top surface 368 and a bottom surface 370. The bottom surface 370 includes waffle patterning similar to that shown in FIG. 3, which provides improved adhesion to the epoxy preform layer 340. The bottom surface 370 further comprises conductive traces 374 which are patterned according to the electronics formed on the top surface 368 of the PCB layer 360. The spacing 375 of the PCB layer 360 includes the gap 376 and a component aperture 378.

Figure 10:
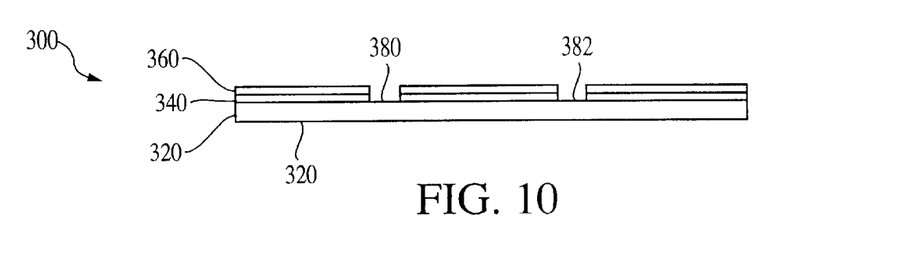
FIG. 10 is a perspective view of the second embodiment.

Referring to FIGS. 9 and 10, (FIG. 10 is a cross-sectional view of the structure 300 in FIG. 9, as assembled) it will be appreciated that the preform spacing 350 and the PCB spacing 375 collectively form wells 380, 382, as shown in FIG. 10, for receiving electronic components and the solder preforms supporting the components. Specifically, the lower component aperture 354 in the preform layer 340 and the upper component aperture 378 in the PCB layer 360 collectively form a first rectangular well 380 for receiving an electronic component, such as an RF power transistor. Similarly, the lower gap 352 in the preform layer 340 and the upper gap 376 in the PCB layer 360 collectively form a second well 382 for receiving a plurality of electronic components. It is to be understood that more or less gaps and/or component apertures may be formed in the preform layer 340 and the PCB layer 360 so as to accommodate the number, spacing and arrangement of electronic components as may be desired. For example, the preform layer 340 and the PCB layer 370 may each comprise three separate pieces so as to form two gaps in each layer. Alternatively, each layer 340, 360 may comprise a single integral structure, thus omitting any gaps, while including multiple component apertures for receiving components which would then be disposed in isolation from each other.

Though the preform layer 340 comprises epoxy which is not electrically conductive, the epoxy may nonetheless be thermally conductive, thus providing excellent heat transfer from the PCB layer 360 to the pallet 320. By primarily using non-conductive epoxy, a lower cost solution is provided when only portions of the more expensive conductive epoxy is strategically placed on the preform layer 340 for grounding. Since non-conductive epoxy provides excellent moisture resistance, it will be appreciated that a tight seal is formed around the edges of the assembly 300. With nearly all of the surface areas of the top pallet surface 326 and the bottom PCB surface 370 attached to the preform layer 340, a more reliable electrical and thermal connection is provided. Furthermore, an assembly fabricated according to the invention is much easier and less expensive to manufacture than prior art assemblies formed according to conventional methods.

Figure 11:
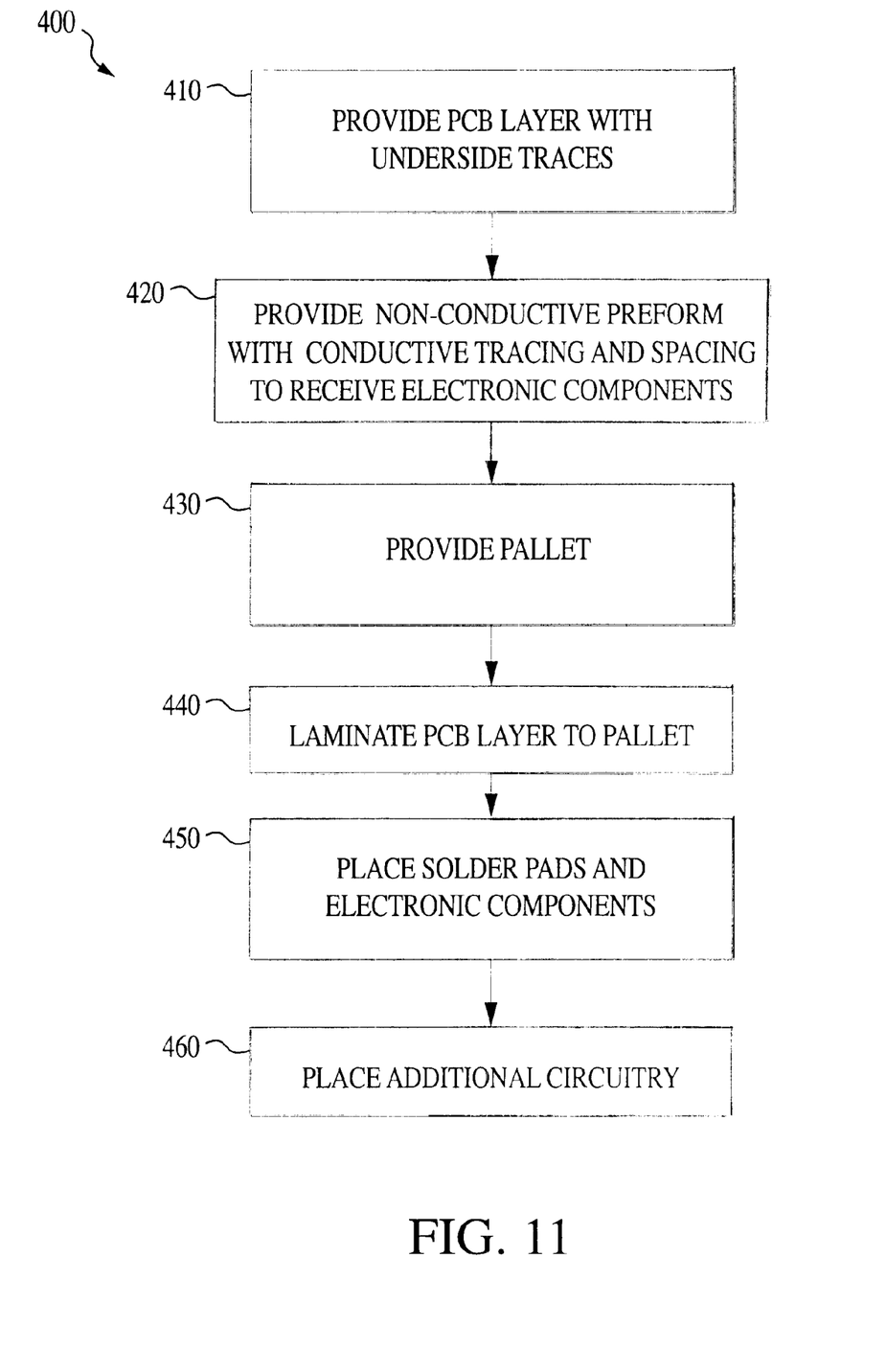
FIG. 11 is a flow diagram illustrating the process of manufacturing the second embodiment of the electronics assembly.

FIG. 11 is a flow diagram illustrating a process 400 of manufacturing the second preferred embodiment 300 of FIGS. 9 and 10. In step 410, a printed circuit board (PCB) layer is provided. In the preferred process, the bottom surface is plated with a thin layer of gold and provided with conductive traces. Mounting holes are formed through the PCB layer. In step 420, a non-conductive preform layer, described above as 440 in connection with FIGS. 9–10, is provided. A pattern as determined by the underside PCB conductive traces and the electronic components is formed in the upper surface of the non-conductive preform layer for receiving conductive epoxy. For example, the pattern may be stamped or routed in the preform layer. The conductive epoxy is then disposed in the pattern, for instance, by laying epoxy film or stencil printing epoxy paste. The conductive and non-conductive epoxy is composed of a thermal set material such that the epoxies will not re-melt once the lamination process is completed. As an example, the epoxy may include Ablefilm 550K. Mounting holes are formed through the preform layer in alignment with the mounting holes of the PCB layer. In step 430, a pallet is provided that is preferably composed of copper. The top surface is plated with a thin layer of gold. Solder mask is then applied to the top surface of the pallet at a region where multiple electronic components will be disposed. In step 440, the PCB layer is laminated to the pallet using a lamination process described in above in connection with FIG. 8. In step 450, conductive solder paste, or solder preforms, are placed in the component wells and electronic components are attached to the solder preform. Step 450 involves reflowing the assembly such that the electronic components are secured to the pallet by the solder. Since the preform layer comprises a thermal set material, it will not melt as the solder preforms are being reflowed. In step 460, additional circuitry and electronic components may be placed on the PCB layer.

It should be appreciated that the specific illustration of the electronics assemblies illustrated in the figures, as well as subsequent illustrations of components thereof and alternate embodiments, are provided for convenience of illustration and explanation rather than accuracy of layout, etc. For example, the various elements are not shown to scale or necessarily in optimal configuration.

It will be appreciated that the methods provided herein provide a much less expensive way of manufacturing reliable electronics module assemblies which are not subject to degradation of thermal and electrical coupling over time. Furthermore, a better electrical and thermal connection is provided between the layers than the bolted down assemblies of the prior art. With electronic components, such as the RF transistors, being coupled to the pallet without having to sit on top of the PCB layer, rework capability is provided. By eliminating fasteners, the capacity of the assembly is increased as more room is available for placement of electronic components. Thus, the various embodiments and methods according to the invention result in lower cost, greater ease in manufacturing, higher capacity, and more effective electrical and thermal coupling.

Many alterations and modifications may be made by those having ordinary skill in the art without departing from the spirit and scope of the invention. Therefore, it must be understood that the illustrated embodiments have been set forth only for the purposes of examples and that they should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification the generic structure, material or acts of which they represent a single species.

The definitions of the words or elements of the following claims are, therefore, defined in this specification to not only include the combination of elements which are literally set forth. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what incorporates the essential idea of the invention.

What is claimed is:

1. A method for assembling an electronics module assembly, the method comprising:
   providing a printed circuit board;
   providing a pallet;
   providing a preform comprising a layer of conductive thermal set epoxy and having a manufacturer's suggested pressure;
   coupling the pallet and the bottom surface of the printed circuit board to opposite sides of the preform to form a sub-assembly; and
   curing the preform by applying pressure to the sub-assembly at least three times an upper range of the manufacturer's suggested pressure while maintaining the sub-assembly at or above the thermal set temperature of the epoxy.

2. The method of claim 1, further comprising cooling the pallet, cured layer of conductive epoxy and printed circuit board.

3. The method of claim 1, wherein providing a printed circuit board further comprises providing a conductive trace on a bottom surface of the printed circuit board.

4. A method for assembling an electronics module assembly, the method comprising:
   providing a printed circuit board;
   providing a conductive trace on a bottom surface of the printed circuit board;
   providing a pallet having a recess in a top surface of the pallet that is aligned with and shaped according to the trace;
   providing a preform comprising a layer of conductive thermal set epoxy;
   coupling the pallet and the bottom surface of the printed circuit board to opposite sides of the preform to form a sub-assembly; and
   curing the preform by applying pressure to the sub-assembly while maintaining the sub-assembly at or above the thermal set temperature of the epoxy.

5. The method of claim 4, further comprising forming an aperture in the layer of the conductive epoxy that is aligned with and shaped according to the trace.

6. The method of claim 1, further comprising providing a space in the layer of conductive epoxy.

7. A method for assembling an electronics module assembly, the method comprising:
   providing a printed circuit board;
   providing a pallet;
   providing a preform comprising a layer of conductive thermal set epoxy;

coupling the pallet and the bottom surface of the printed circuit board to opposite sides of the preform to form a sub-assembly;

curing the preform by applying pressure to the sub-assembly while maintaining the sub-assembly at or above the thermal set temperature of the epoxy;

providing a space in the layer of conductive epoxy; and coupling an electronic component to the pallet in the space provided in the layer of conductive epoxy.

8. The method of claim 7, wherein coupling an electronic component to the pallet comprises:

disposing non-conductive epoxy in the space; and disposing the electronic component on the non-conductive epoxy.

9. The method of claim 8, further comprising reflowing the non-conductive epoxy.

10. The method of claim 1, wherein curing the preform comprises applying at least 30 PSI to the sub-assembly.

11. The method of claim 1, wherein curing the preform comprises applying between 50 and 70 PSI at about 150° C.

12. A method for assembling an electronics module assembly, the method comprising:

providing a printed circuit board having a waffle pattern on a bottom surface of the printed circuit board;

providing a pallet;

providing a preform comprising a layer of conductive thermal set epoxy;

coupling the pallet and the bottom surface of the printed circuit board to opposite sides of the preform to form a sub-assembly; and curing the preform by applying pressure to the sub-assembly while maintaining the sub-assembly at or above the thermal set temperature of the epoxy.

13. A method for assembling an RF power amplifier assembly, the method comprising:

providing a printed circuit board;

providing a preform comprising a layer of non-conductive epoxy;

providing a space in the layer of non-conductive epoxy;

forming at least one trace of conductive epoxy on the layer of non-conductive epoxy;

coupling a pallet and the bottom surface of the printed circuit board to opposite sides of the preform to form a sub-assembly;

curing the preform; and mounting an RF power transistor to the pallet in the space in the layer of non-conductive epoxy.

14. The method of claim 13, wherein curing the preform comprises applying to the sub-assembly a pressure of at least 30 PSI.

15. The method of claim 14, wherein curing the preform further comprises heating the sub-assembly at a predetermined temperature corresponding to the thermal set temperature of the epoxy.

16. The method of claim 13, further comprising cooling the pallet, cured preform and printed circuit board.

17. The method of claim 13, further comprising removing excess non-conductive epoxy from the space in the layer.

18. The method of claim 13, wherein providing a printed circuit board further comprises forming a conductive trace on a bottom surface of the printed circuit board.

19. The method of claim 18, wherein forming a trace of conductive epoxy on the layer of non-conductive epoxy comprises aligning the trace of conductive epoxy with the conductive trace on the bottom surface of the printed circuit board.

20. The method of claim 13, further comprising coupling an electronic component to the pallet.

21. The method of claim 20, wherein coupling an electronic component to the pallet comprises:

disposing conductive solder in the space; and disposing the electronic component on the conductive solder.

22. The method of claim 21, comprising reflowing the conductive solder.

23. The method of claim 21, wherein forming at least one trace of conductive epoxy on the layer of non-conductive epoxy comprises forming traces of conductive epoxy adjacent to the space.

24. The method of claim 13, wherein providing a printed circuit board with at least one electronic component on a bottom surface further comprises providing protrusions on the bottom surface adapted to contact the preform.

25. An electronics module assembly comprising:

a printed circuit board having a first board surface and an opposite second board surface and a plurality of electronic devices mounted thereon;

at least one discrete electronic component;

a cured preform having a first preform surface and a second preform surface, the first preform surface being coupled to the second board surface, the preform comprising a layer of epoxy with at least one space shaped to accommodate the component shape; and a pallet coupled to the second preform surface and to the discrete electronic component.

26. The assembly of claim 25, wherein the layer of epoxy comprises conductive epoxy.

27. The assembly of claim 26, further comprising conductive solder disposed in the space.

28. The assembly of claim 26, wherein the electronic component is disposed on the conductive solder.

29. The assembly of claim 26, wherein:

the printed circuit board comprises a conductive trace on the second board surface;

the cured preform comprises an aperture aligned with and shaped according to the conductive trace on the second board surface;

the pallet comprises a recess aligned with and shaped according to the conductive trace on the second board surface.

30. The assembly of claim 25, wherein the layer of epoxy comprises non-conductive epoxy.

31. The assembly of claim 30, wherein the cured preform further comprises a trace of conductive epoxy disposed on the first preform surface.

32. The assembly of claim 25, wherein the printed circuit board further comprises a plurality of protrusions on the second surface contacting the preform.

33. The assembly of claim 25, wherein the pallet comprises copper.

34. An RF power amplifier assembly comprising:

a housing;

a circuit including an input signal to be amplified and an output signal; and an electronics module comprising:

a printed circuit board, a power amplifier component, and a cured preform coupled to a bottom of the printed circuit board, the cured preform comprising a layer of epoxy and a cut-out area in the layer shaped to accommodate the shape of the power amplifier component, and a pallet coupled to a bottom of the preform and the power amplifier component.

35. The assembly of claim 34, wherein the layer of epoxy comprises conductive epoxy.

36. The assembly of claim 35, wherein the electronics module further comprises non-conductive epoxy disposed in the cut-out area of the layer.

37. The assembly of claim 34, wherein the layer of epoxy comprises non-conductive epoxy.

38. The assembly of claim 37, wherein the cured preform further comprises traces of conductive epoxy disposed on the layer of non-conductive epoxy.

39. The assembly of claim 37, wherein the preform further comprises conductive trace lines disposed on a surface thereof.

40. The assembly of claim 34, wherein the pallet comprises copper.

41. The assembly of claim 34, further comprising a heat sink coupled to the electronics module.

* * * * *